United States Patent
Tsuda et al.

(10) Patent No.: US 8,076,165 B2
(45) Date of Patent: Dec. 13, 2011

(54) METHOD OF MANUFACTURING P-TYPE NITRIDE SEMICONDUCTOR AND SEMICONDUCTOR DEVICE FABRICATED BY THE METHOD

(75) Inventors: Yuhzoh Tsuda, Sakurai (JP); Shigetoshi Ito, Shijonawate (JP); Mototaka Taneya, Nara (JP); Yoshihiro Ueta, Yamatokoriyama (JP); Teruyoshi Takakura, Tenri (JP)

(73) Assignee: Sharp Kabushiki Kaisha, Osaka (JP)

(*) Notice: Subject to any disclaimer, the term of this patent is extended or adjusted under 35 U.S.C. 154(b) by 814 days.

(21) Appl. No.: 11/887,153

(22) PCT Filed: Mar. 2, 2006

(86) PCT No.: PCT/JP2006/303985
§ 371 (c)(1),
(2), (4) Date: Sep. 26, 2007

(87) PCT Pub. No.: WO2006/112167
PCT Pub. Date: Oct. 26, 2006

(65) Prior Publication Data
US 2009/0121320 A1    May 14, 2009

(30) Foreign Application Priority Data
Apr. 1, 2005   (JP) .................................. 2005-105827

(51) Int. Cl.
*H01L 21/00* (2006.01)
(52) U.S. Cl. ....... 438/22; 438/46; 438/47; 257/E33.023; 257/E33.025; 257/E33.028; 257/E23.033
(58) Field of Classification Search ................ 438/22, 438/46, 47
See application file for complete search history.

(56) References Cited

U.S. PATENT DOCUMENTS

| | | | | |
|---|---|---|---|---|
| 5,693,963 | A * | 12/1997 | Fujimoto et al. | 257/94 |
| 7,056,755 | B1 * | 6/2006 | Kamei et al. | 438/45 |
| 2003/0153168 | A1 * | 8/2003 | Tsuchida et al. | 438/520 |
| 2005/0042787 | A1 | 2/2005 | Ito et al. | |
| 2005/0227453 | A1 | 10/2005 | Miki et al. | |

FOREIGN PATENT DOCUMENTS

| | | |
|---|---|---|
| JP | 05-183189 | 7/1993 |
| JP | 09-129929 | 5/1997 |
| JP | 09-167857 | 6/1997 |
| JP | 2001-119065 | 4/2001 |
| JP | 2002-134416 | 5/2002 |
| JP | 2003-133649 | 5/2003 |
| JP | 2003-243302 | 8/2003 |
| JP | 2004-103930 | 4/2004 |
| JP | 2004-146525 | 5/2004 |
| TW | 387106 | 4/2000 |

(Continued)

*Primary Examiner* — Long Tran
(74) *Attorney, Agent, or Firm* — Harness, Dickey & Pierce, P.L.C.

(57) ABSTRACT

The present invention includes a first step of forming a nitride semiconductor layer by metal organic chemical vapor deposition by using a first carrier gas containing a nitrogen carrier gas and a hydrogen carrier gas of a flow quantity larger than that of the nitrogen carrier gas to thereby supply a raw material containing Mg and a Group V raw material containing N, and a second step of lowering a temperature by using a second carrier gas to which a material containing N is added, and hence solves the problems.

8 Claims, 2 Drawing Sheets

FOREIGN PATENT DOCUMENTS

| | | |
|---|---|---|
| TW | 488083 | 5/2002 |
| TW | 492113 | 6/2002 |
| TW | 567526 | 12/2003 |
| TW | 586150 | 5/2004 |
| WO | WO 03/068699 | 8/2003 |

* cited by examiner

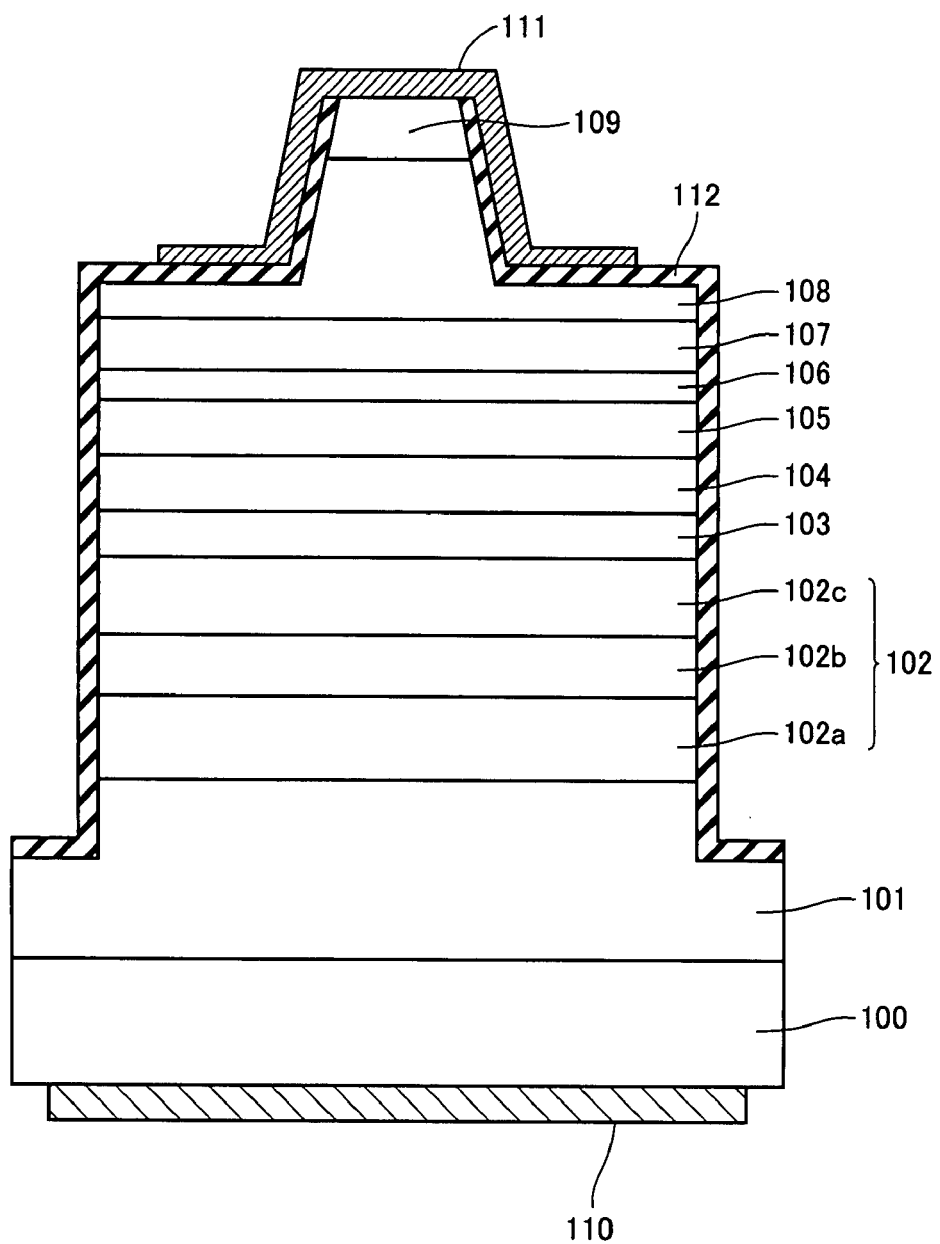

METHOD OF MANUFACTURING P-TYPE NITRIDE SEMICONDUCTOR AND SEMICONDUCTOR DEVICE FABRICATED BY THE METHOD

TECHNICAL FIELD

The present invention relates to a method of manufacturing a p-type nitride semiconductor and a semiconductor device fabricated by the method.

BACKGROUND ART

Conventionally, a nitride semiconductor layer fabricated by a metal organic chemical vapor deposition method (MOCVD method) and doped with p-type impurities was electrically neutral and could not obtain a p-type electric property, and had significantly high resistance. Accordingly, Japanese Patent Laying-Open No. 05-183189 (Patent Document 1) describes that, after the completion of crystal growth, the nitride semiconductor layer doped with p-type impurities and having significantly high resistance is subjected to an annealing treatment in an atmosphere that contains substantially no hydrogen and at a temperature of at least 400° C., to thereby eliminate hydrogen from the nitride semiconductor layer, so that a nitride semiconductor having p-type conductivity and low resistance can be obtained from a nitride semiconductor having high resistance.

Meanwhile, Japanese Patent Laying-Open No. 09-129929 (Patent Document 2) and Japanese Patent Laying-Open No. 2004-103930 (Patent Document 3) describe a manufacturing method for obtaining a high p-type carrier concentration or low resistivity after the completion of crystal growth even without an annealing treatment for obtaining a p-type property.

According to the manufacturing method disclosed in Patent Document 2, when a p-type cladding layer and a p-type contact layer are stacked, for example, they are fabricated under the condition that an inert gas is excessive with respect to hydrogen and a flow quantity ratio of hydrogen to the inert gas is at least 0.75%, and after the completion of crystal growth, a substrate is naturally cooled with a flow quantity of the inert gas increased. Here, in the stage where the flow quantity of the inert gas is increased, a flow quantity ratio between the inert gas and ammonia is set to 2:1. According to this document, such a manufacturing method enables electrical activation of at least 7% of p-type impurities elements, and obtainment of a significantly high carrier concentration of at least $2.4 \times 10^{18}$ cm$^{-3}$.

Furthermore, according to the manufacturing method disclosed in Patent Document 3, a GaN-based semiconductor crystal containing p-type impurities is grown in a crystal growing atmosphere containing an inert gas at a ratio of at least 50 vol %, and after the completion of crystal growth, the atmosphere is replaced with a cooling atmosphere containing ammonia at a ratio of 0.1%-30 vol % at the crystal growth temperature, and the semiconductor crystal is cooled in the cooling atmosphere. According to this document, such a manufacturing method enables a treatment for activating p-type impurities to be stably performed without a heat treatment after growth.

Patent Document 1: Japanese Patent Laying-Open No. 05-183189

Patent Document 2: Japanese Patent Laying-Open No. 09-129929

Patent Document 3: Japanese Patent Laying-Open No. 2004-103930

DISCLOSURE OF THE INVENTION

Problems to be Solved by the Invention

However, the p-type nitride semiconductor layer obtained through an annealing treatment after growth, as disclosed in Patent Document 1, did not have sufficiently low resistivity. Reduction in resistivity directly leads to reduction in power consumption, and hence is significantly important in view of the application to a nitride semiconductor-based light-emitting element or an electronic device. As to a nitride semiconductor, a p-type one generally has resistivity significantly higher than that of an n-type one, so that further reduction in resistivity of the p-type one has been sought. Furthermore in Patent Document 1, there also arose a problem of thermal damage to, and hence degradation of, a nitride semiconductor layer containing In (e.g. a light-emitting element including an InGaN active layer), because of the annealing treatment after crystal growth. In contrast, the manufacturing methods disclosed in Patent Documents 2 and 3, which require no annealing treatment step, or if any, only require short annealing treatment time, are quite beneficial because thermal degradation of the element in the manufacturing step can be prevented. However, when the inventors of the present invention conducted a supplementary test, there was a case where a p-type electric property was not exhibited after crystal growth, or if a p type was obtained, resistivity was significantly high (or a p-type carrier concentration was significantly low), so that the properties as disclosed in the inventions could not be obtained.

A first problem to be solved by the present invention is to provide a method of manufacturing a p-type nitride semiconductor having low resistivity and exhibiting p-type conductivity with high reproducibility, without subjecting a nitride semiconductor layer doped with p-type impurities to an annealing treatment after the completion of its growth. This manufacturing method requires no annealing treatment step, or if any, only requires short annealing treatment time after the completion of crystal growth, so that it is possible to prevent thermal damage to, and hence degradation of, a nitride semiconductor layer containing In (e.g. a light-emitting element containing an InGaN active layer).

Next, a second problem to be solved by the present invention is to provide a manufacturing method of forming the p-type nitride semiconductor according to the present invention and obtained by solving the first problem above, into a p-type nitride semiconductor with much lower resistivity. This makes it possible to further reduce power consumption in a nitride semiconductor-based light-emitting element or an electronic device.

Means for Solving the Problems

The present invention includes a first step of forming a nitride semiconductor layer by metal organic chemical vapor deposition by using a first carrier gas containing a nitrogen gas (nitrogen carrier gas) and a hydrogen gas (hydrogen carrier gas) of a flow quantity larger than a flow quantity of the nitrogen gas to thereby supply a raw material containing magnesium (Mg) and a Group V raw material containing nitrogen (N); and a second step of lowering a temperature, by using a second carrier gas to which a material containing nitrogen (N) is added at a concentration of at least 0.01% and less than 20%, and hence can solve the first problem thereof.

Here, the concentration of at least 0.01% and less than 20% as to the material containing N was calculated by (a flow quantity of the material containing N)/(the flow quantity of the material containing N+a flow quantity of the second carrier gas).

It is preferable that ammonia is used at a concentration of at least 0.01% and at most 5% as the material containing N of the present invention. The use of the present manufacturing method enables obtainment of a p-type nitride semiconductor having low resistivity with high reproducibility without an annealing treatment for obtaining a p-type property after the completion of the second step.

The present invention is characterized in that in the first carrier gas, a ratio of the hydrogen carrier gas with respect to the total flow quantity of the nitrogen carrier gas and the hydrogen carrier gas is more than 70% and at most 95%. Here, the ratio of the hydrogen carrier gas is calculated by (a flow quantity of the hydrogen carrier gas)/(a flow quantity of the nitrogen carrier gas+the flow quantity of the hydrogen carrier gas).

In the present invention, it is preferable that the total layer thickness of the nitride semiconductor layer fabricated by the first step is at least 0.5 μm.

In the present invention, it is preferable that the total layer thickness of a layer including a nitride semiconductor with an aluminum (Al) composition ratio of at least 2%, out of a plurality of nitride semiconductor layers fabricated by the first step, is at least 0.3 μm.

The present invention is characterized in that the raw material containing magnesium is bis(ethyl cyclopentadienyl) magnesium.

The present invention is characterized in that a flow quantity of the Group V raw material containing N is smaller than the flow quantity of the hydrogen carrier gas in the first carrier gas.

The present invention is characterized in that a flow quantity of the second carrier gas is larger than the flow quantity of the nitrogen carrier gas in the first carrier gas.

In the present invention, it is preferable that the second carrier gas is argon or nitrogen.

The second step of the present invention is characterized in that it is a step of lowering the temperature to 400° C. or lower, and that time required for reaching 400° C. is at most 25 minutes.

The present invention is characterized in that dimethyl hydrazine is used at a concentration of at least 0.01% and at most 2% as the material containing N. Here, the concentration of dimethyl hydrazine is calculated by (a flow quantity of dimethyl hydrazine)×(a vapor pressure of dimethyl hydrazine)/(an atmospheric pressure)/(a flow quantity of the second carrier gas+the flow quantity of dimethyl hydrazine×the vapor pressure of dimethyl hydrazine/the atmospheric pressure).

The present invention is characterized in that it includes a third step of subjecting the nitride semiconductor layer to an annealing treatment after the second step in an inert gas atmosphere for at least one minute and at most 15 minutes. The present invention can thereby solve the second problem thereof. Here, the nitride semiconductor layer after the second step has already exhibited p-type conductivity after the completion of crystal growth, owing to the present invention described above.

The present invention is characterized in that an annealing temperature is at least 700° C. and at most 900° C.

The present invention is characterized in that in the third step, ammonia is further added at a concentration of at least 0.01% and at most 5% in addition to the inert gas. Here, the concentration of ammonia in the third step is calculated by (a flow quantity of ammonia)/(the flow quantity of ammonia+a flow quantity of the inert gas).

The present invention is characterized in that in the third step, hydrogen is further added at a concentration of at least 10 ppm and at most 500 ppm in addition to the inert gas. Here, the concentration of hydrogen is calculated by (a flow quantity of hydrogen)/(the flow quantity of hydrogen+a flow quantity of the inert gas).

The present invention relates to a semiconductor device including a p-type nitride semiconductor layer fabricated by the method of manufacturing the p-type nitride semiconductor according to the present invention.

EFFECTS OF THE INVENTION

By using the manufacturing method according to the present invention, a nitride semiconductor layer which contains Mg and a crystal of which is grown by a metal organic chemical vapor deposition method can be formed into a p-type nitride semiconductor layer having low resistivity and exhibiting p-type conductivity with high reproducibility without a heat treatment after the completion of its growth. For example, if the present manufacturing method is applied to a nitride semiconductor light-emitting element including an active layer made of InGaN, the method requires no annealing treatment step for allowing a nitride semiconductor layer containing Mg to obtain a p-type property, or if any, only requires short annealing treatment time, after the completion of crystal growth. Accordingly, it is possible to prevent thermal damage to, and hence degradation of, the InGaN active layer due to the annealing treatment step. As a result, luminous efficiency is improved and longer lifetime is obtained. Furthermore, a p-type nitride semiconductor can be obtained with high reproducibility, so that yield rate in nondefective products is improved as well.

Furthermore, by applying the annealing treatment according to the present invention to the p-type nitride semiconductor layer, resistivity obtained after the completion of growth can further be lowered. It is thereby possible to further reduce power consumption in a nitride semiconductor-based light-emitting element or an electronic device.

BRIEF DESCRIPTION OF THE DRAWINGS

FIG. 3 shows an example of a nitride semiconductor laser element.

DESCRIPTION OF THE REFERENCE SIGNS

Figure 1:
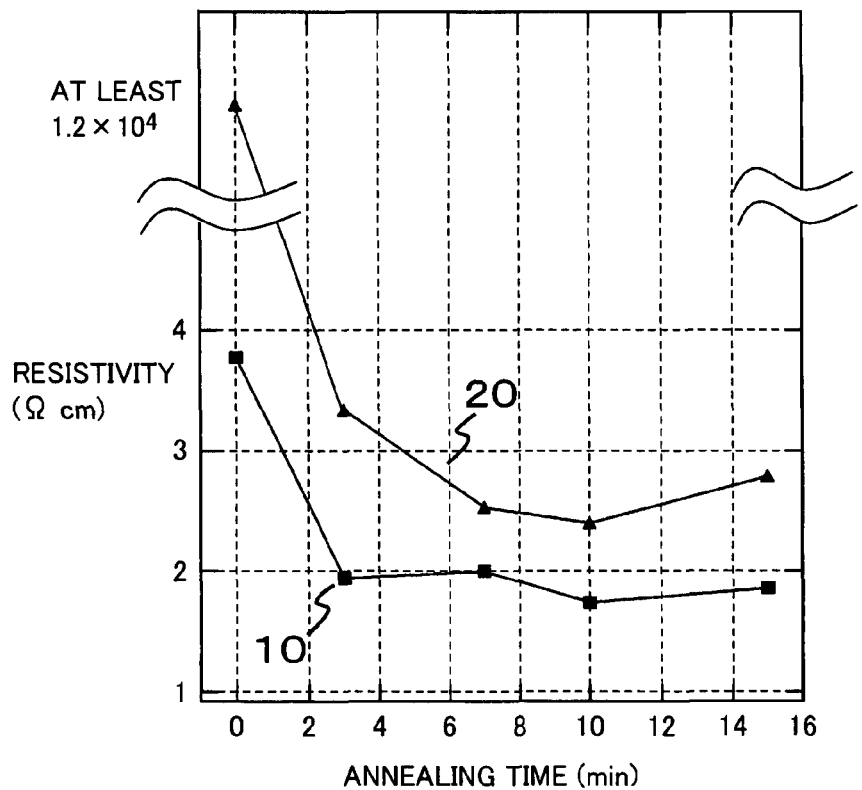
FIG. 1 provides experimental data showing a relationship between annealing time and resistivity.

10: sample A, 20: sample B, 100: n-type GaN substrate, 101: n-type GaN layer, 102: n-type AlGaN cladding layer, 103: n-type GaN light guide layer, 104: light-emitting layer, 105: intermediate layer, 106: carrier block layer made of AlGaN, 107: p-type GaN light guide layer, 108: p-type AlGaN cladding layer, 109: p-type GaN contact layer, 110: n electrode, 111: p electrode, 112: $SiO_2$ dielectric film.

BEST MODES FOR CARRYING OUT THE INVENTION

First Embodiment

A first embodiment can mainly solve the first problem.

Initially, a substrate is placed in a metal organic chemical vapor deposition device (MOCVD device). Here, the substrate collectively refers to a base material such as sapphire, GaN, AlGaN, SiC, Si, or ZrB$_2$, or the one including a nitride semiconductor layer, a crystal of which is grown on the base material. The substrate is heated to a certain temperature. By using a first carrier gas containing a nitrogen carrier gas and a hydrogen carrier gas of a flow quantity larger than that of the nitrogen carrier gas, a Group III raw material, a raw material containing Mg, and a Group V raw material containing N are supplied to form a nitride semiconductor layer. The step described above is referred to as a first step.

After the first step, a second step of lowering a temperature of the substrate by using a second carrier gas to which a material containing N is added at a concentration of at least 0.01% and less than 20% is completed.

Through these steps, the nitride semiconductor layer ensures crystallinity of high quality, and exhibits p-type conductivity with high reproducibility without an annealing step after the second step, so that it was possible to obtain a nitride semiconductor layer having low resistivity (see Example 1 described below).

Here, the nitride semiconductor layer is specifically GaN, AlGaN, InAlGaN, InGaN, or the like, containing Mg.

If the nitride semiconductor layer is GaN containing Mg or AlGaN containing Mg, a temperature at which such a semiconductor layer obtains favorable crystallinity is at least 900° C. and at most 1100° C., more preferably at least 1000° C. and at most 1080° C. If the nitride semiconductor layer is InAlGaN containing Mg, a temperature at which it obtains favorable crystallinity is at least 700° C. and at most 1000° C. If the nitride semiconductor layer is InGaN containing Mg, a temperature at which it obtains favorable crystallinity is at least 700° C. and at most 850° C.

As the nitrogen carrier gas used in the first step, it is preferable to use nitrogen having a moisture concentration controlled to be at most 1 ppb. Although nitrogen is preferable for its inexpensiveness, it generally has hygroscopicity and hence contains much moisture, so that it is important to lower the moisture concentration thereof so as to obtain a nitride semiconductor having a p-type electric property. As a method for stably supplying to the MOCVD device the nitrogen having a moisture concentration of at most 1 ppb, there is used a nitrogen refining device utilizing an gettering effect. As to the generally-used, adsorption and regeneration-type nitrogen refining device, moisture once adsorbed (or impurities such as oxygen) is/are released again in a regeneration step in an adsorption column, and hence a purity of nitrogen may become unstable. In contrast, once the nitrogen refining device utilizing a gettering effect captures moisture (or impurities such as oxygen), it never releases it/them again, which enables stable supply of high-purity nitrogen. However, the gettering-type device can no longer produce the effect above upon exhaustion of a target, and hence requires high cost. As a method of arranging the nitrogen refining device in view of stable supply of high-purity nitrogen, it is preferable to provide in series one or more nitrogen refining devices utilizing an gettering effect. If economical efficiency is considered, it is preferable to provide in series at least two adsorption and regeneration-type nitrogen refining devices, or provide in series a plurality of adsorption and regeneration-type nitrogen refining devices and then provide a nitrogen refining device utilizing an gettering effect. As a method of arranging a nitrogen refining device that enables stable supply of high-purity nitrogen and achieves excellent economic efficiency, there are used two nitrogen refining devices including an adsorption and regeneration-type nitrogen refining device provided on a first stage (on a nitrogen supply side), and a nitrogen refining device utilizing an gettering effect provided on a subsequent stage (on the MOCVD side).

The raw material containing Mg specifically refers to cyclopentadienyl magnesium or bis(ethyl cyclopentadienyl) magnesium. Out of these raw materials, the use of bis(ethyl cyclopentadienyl) magnesium was particularly preferable because it could improve the effect of the present invention. Depending on the raw materials containing Mg, the way how Mg serving as p-type impurities is taken in into the nitride semiconductor layer may subtly differ. Furthermore, bis (ethyl cyclopentadienyl) magnesium is a liquid raw material, and thus is highly responsive to variations in amount of the raw material to be supplied, when compared with cyclopentadienyl magnesium, which is a solid raw material.

Furthermore, the present invention uses in the first step the hydrogen carrier gas of a flow quantity larger than that of the nitrogen carrier gas, and thus produces an effect of improving diffusional efficiency of the raw material containing Mg in the carrier gases. It is considered that improvement in responsiveness to variations in amount of the raw material to be supplied, and improvement in diffusional efficiency of the raw material containing Mg, aid in uniform addition of Mg serving as p-type impurities into the nitride semiconductor layer, and contribute to obtainment of p-type nitride semiconductor layer having low resistivity and exhibiting p-type conductivity with high reproducibility without a heat treatment after the completion of crystal growth.

For the Group III raw material, it is possible to use tri-methyl gallium, tri-ethyl gallium, tri-methyl aluminum, tri-ethyl aluminum, tri-methyl indium, tri-ethyl indium, or the like.

An amount of the Group V raw material containing N to be supplied, which is used in the first step of the present invention, is preferably at least one liter and at most 10 liters per minute, and the flow quantity of the Group V raw material containing N is suitably smaller than that of the hydrogen carrier gas. The raw material containing Mg is more likely to diffuse in hydrogen than in the Group V raw material containing N, and hence the above-described value is suitably used as a flow quantity of the Group V raw material containing N. Here, as the Group V raw material containing N, it is possible to use ammonia, dimethyl hydrazine, monomethyl hydrazine, or the like. Improvement in diffusion of the raw material containing Mg enables uniform addition of Mg serving as p-type impurities into the nitride semiconductor layer, and hence formation of a nitride semiconductor layer of high quality. It is thereby possible to obtain a p-type nitride semiconductor layer having low resistivity and exhibiting p-type conductivity with high reproducibility, without a heat treatment after the completion of crystal growth.

The nitrogen carrier gas or the hydrogen carrier gas in the first step also includes a bubbling gas used for vaporizing or sublimating the Group III raw material to supply the same to the substrate. For example, if bubbling is performed with hydrogen to vaporize tri-methyl gallium serving as the Group III raw material, the flow quantity thereof is added to the flow quantity of the hydrogen carrier gas. Similarly, if bubbling is performed with nitrogen, the flow quantity thereof is added to the flow quantity of the nitrogen carrier gas.

In the first step, it is preferable that the flow quantity of the nitrogen carrier gas is at least two liters and at most 10 liters per minute, while the flow quantity of the hydrogen carrier gas is at least 10 liters and at most 45 liters per minute. In the present invention, however, the flow quantity of the hydrogen carrier gas must be larger than that of the nitrogen carrier gas. This idea is the inverse of that in the conventional technique. The details thereof will hereinafter be described.

In the conventional technique, in order to allow a nitride semiconductor layer having p-type impurities added thereto to have a p-type electric property after the completion of crystal growth without an annealing treatment, it was necessary to form such a nitride semiconductor layer in an atmosphere containing a hydrogen carrier gas and a nitrogen carrier gas of an amount larger than that of the hydrogen carrier gas, as disclosed in, for example, Patent Document 2 or 3. One of the reasons is that failure to obtain a p-type nitride semiconductor after the completion of growth is generally considered to be attributable to Mg, which has been added into the nitride semiconductor, binding to hydrogen and failing to act as p-type impurities (Mg being deactivated by hydrogen).

However, resistivity of the nitride semiconductor layer fabricated by such a fabricating method was very high after the completion of crystal growth, and p-type conductivity was not exhibited, or even if p-type conductivity was exhibited, uniform resistivity was not obtained in an arbitrary surface of the substrate, so that a low resistivity part and a high resistivity part exist therein in a mixed manner. As such, with the conventional manufacturing method, it was not possible to obtain with high reproducibility a nitride semiconductor layer exhibiting a p-type property after the completion of crystal growth. Furthermore, when a current was injected into an element fabricated by the conventional manufacturing method, a voltage increased with elapse of the time, resulting in breakage of multiple elements.

Accordingly, to examine the causes thereof, a nitride semiconductor layer having Mg serving as p-type impurities added thereto was fabricated with a function of x, where x represents a ratio of the hydrogen carrier gas with respect to the sum of the nitrogen carrier gas and the hydrogen carrier gas. As a result, an X-ray analysis revealed that when the nitride semiconductor layer was formed with $x \leqq 50\%$, a tilt component (a component contributing to an orientation of the crystal) in a direction of crystal growth of the nitride semiconductor layer and/or a twist component (a component contributing to an edge dislocation density of the crystal) in a crystal plane was/were increased, resulting in deterioration of crystallinity. This tendency became remarkable as the ratio x of the hydrogen carrier gas was decreased. Furthermore, a surface morphology of the nitride semiconductor layer also deteriorated as the ratio x of the hydrogen carrier gas was decreased. The surface morphology more remarkably deteriorated as a layer thickness of the nitride semiconductor layer was increased. For example, a surface morphology started deteriorating approximately when the layer thickness exceeded 0.3 μm in the case of GaN having Mg added thereto, and approximately when the layer thickness exceeded 0.2 μm in the case of AlGaN having Mg added thereto. In view of the foregoing, it is considered that the problems in the conventional technique described above are caused by deterioration in crystal quality of the nitride semiconductor layer having Mg serving as p-type impurities added thereto. If there is no need to consider reproducibility or yields, even the conventional technique described above may be applicable to a light-emitting diode or the like including a p-type nitride semiconductor layer having a relatively small thickness. However, the conventional technique is not applicable to a laser diode that requires a p-type nitride semiconductor layer of high quality and having a large thickness (at least 0.3 μm or more).

As the reason why crystal quality of the nitride semiconductor layer having Mg added thereto depended on the ratio x of the hydrogen carrier, the following three points can be considered. Firstly, decrease in ratio x of the hydrogen carrier causes reduction in decomposition efficiency of the Group III raw material and the raw material containing Mg that constitute the nitride semiconductor layer, and thus causes deterioration in crystal quality. Secondly, decrease in ratio of the hydrogen carrier causes insufficient diffusion of these raw material gases in the carrier gases (nitrogen has diffusional efficiency lower than that of hydrogen), resulting in nonuniform distribution of the raw materials in the substrate. Thirdly, to grow a nitride semiconductor layer of high quality (particularly when a nitride semiconductor layer containing Al is to be formed), it is necessary to grow a crystal at a flow velocity of at least 50 cm/second. However, the higher flow velocity makes the above-described second tendency more remarkable.

To solve these problems, in the first step of the present invention, the flow quantity of the hydrogen carrier gas is set to be larger than that of the nitrogen carrier gas. Crystallinity of the nitride semiconductor layer fabricated as such was significantly favorable, hardly depending on its layer thickness. This seems to be because increase in ratio of the hydrogen carrier gas with respect to (the nitrogen carrier gas+the hydrogen carrier gas) in the first carrier gas causes improvement in decomposition efficiency of the raw material gases that constitute the nitride semiconductor layer, as well as sufficient diffusion of these raw material gases. Furthermore, even if the crystal was grown at a flow velocity of at least 50 cm/second, which is required to grow a crystal of a nitride semiconductor layer of high quality, nonuniform distribution did not occur in the substrate. As such, with the use of the first step according to the present invention, a nitride semiconductor layer of high quality can be formed even if the total layer thickness of the nitride semiconductor layer is at least 0.5 μm, or even if the total layer thickness of a layer including a nitride semiconductor with an Al composition ratio of at least 2% is at least 0.3 μm. In other words, this means that a p-type nitride semiconductor layer necessary for fabricating a laser diode can be provided.

Here, the ratio of the hydrogen carrier gas in the first carrier gas preferably falls within a range of higher than 50% and lower than 100%. As the ratio of the hydrogen carrier gas increases, crystallinity of the nitride semiconductor layer becomes favorable. However, remarkable improvement in crystallinity can no longer be observed approximately when 70% is exceeded, and crystallinity becomes approximately constant. If the ratio of the hydrogen carrier gas exceeds 95%, crystal growth is decelerated in a direction parallel to (in an a-axis direction of) the substrate surface of the nitride semiconductor, and if 100% is reached, a minute pit is often generated at a surface of the nitride semiconductor layer. This is because the hydrogen carrier gas serves to promote crystal growth in a direction of a crystallographic axis (in a c-axis direction) of the nitride semiconductor, while the nitrogen carrier gas serves to promote crystal growth in an in-plane direction (in the a-axis direction) of the nitride semiconductor. Deceleration of the growth in the a-axis direction is not preferable because this generates a minute pit at a surface of the nitride semiconductor layer, or causes reduction in mobility in the in-plane direction in the p-type electric property. Accordingly, the most preferable range for the ratio of the hydrogen carrier gas in the first carrier gas is higher than 70% and at most 95%.

Next, the nitride semiconductor layer of high quality obtained by the first step of the present invention can be formed into a p-type nitride semiconductor having low resistivity and exhibiting p-type conductivity with high reproducibility by the second step according to the present invention, without an annealing treatment after the completion of growth. The second step according to the present invention is characterized in that a second carrier gas to which a material containing N is added at a concentration of at least 0.01% and less than 20% is used to lower a temperature from the temperature at which the crystal growth is completed. An optimal material as the material containing N, which is used at a concentration of at least 0.01% and less than 20%, is ammonia to be used at a concentration of at least 0.01% and at most 5%.

Here, the temperature at which the crystal growth is completed is defined as a temperature immediately after the completion of crystal growth of the last nitride semiconductor layer, out of a plurality of nitride semiconductor layers, crystal of which should be grown in the MOCVD device. If the nitride semiconductor layer formed in the first step corresponds to the last nitride semiconductor layer described above, a temperature for initiating the second step corresponds to the temperature immediately after the completion of crystal growth of the nitride semiconductor layer in the first step. If a layer is formed by another step between the first step and the second step, a temperature immediately after the completion of crystal growth of the relevant layer corresponds to the temperature at which the crystal growth is completed.

To obtain a nitride semiconductor layer with excellent crystallinity, it is generally necessary to grow a crystal of the nitride semiconductor at a significantly high growth temperature of at least 700° C. and at most 1100° C. Furthermore, nitrogen to be constitute the nitride semiconductor layer has high volatility, so that intake of nitrogen is easily inhibited (a nitride semiconductor is decomposed (etched)) if ammonia, which serves as a nitrogen raw material of the nitride semiconductor, is not supplied in a range of the high growth temperature described above. To prevent this, in the conventional practice, a temperature is lowered after the completion of crystal growth of the nitride semiconductor layer, with an excessive amount of ammonia supplied. When a temperature of the nitride semiconductor layer formed by the first step of the present invention was lowered with the use of a second carrier gas containing an excessive amount of ammonia at a concentration of 30% in accordance with the conventional manufacturing method (here, nitrogen was used as the second carrier gas), the nitride semiconductor layer achieved a significantly favorable surface. However, it had significantly high resistance after the completion of crystal growth, and exhibited no p-type electric property. According to the detailed test results by the inventors of the present invention, it was found that if a temperature was lowered at an ammonia concentration of at least 0.01% and at most 5%, which concentration is much lower than that in the conventional practice, the nitride semiconductor layer fabricated in the first step of the present invention exhibited favorable p-type electric property after the completion of crystal growth with high reproducibility (the favorable p-type electric property specifically refers to exhibition of low resistivity or a high hole carrier concentration) (for the details thereof, see Example 1 described below). Furthermore, observation at least under an optical microscope revealed that a surface of the nitride semiconductor layer was not roughened. An ammonia concentration of lower than 0.01% was not preferable because the nitride semiconductor layer had its surface roughened during the temperature lowering process and exhibited no p-type electric property. In contrast, if an ammonia concentration was higher than 5%, the nitride semiconductor layer after the completion of crystal growth had resistivity increased in accordance with the ammonia concentration, even though it exhibited p-type conductivity. An ammonia concentration exceeding 10% caused remarkable increase in resistivity, and an ammonia concentration of at least 20% caused high resistance, so that resistivity could not be measured by Hall measurement. Here, the ammonia concentration is a concentration calculated by (a flow quantity of ammonia)/(the flow quantity of ammonia+a flow quantity of a second carrier gas). With this formula, it is possible to calculate a flow quantity at which an ammonia concentration of at least 0.01% and at most 5% is achieved.

For the second carrier gas used in the second step, it is possible to use nitrogen or argon. If nitrogen is used as the second carrier gas, it is preferable to use nitrogen having a moisture concentration of at most 1 ppb. This is because, although a nitrogen gas is preferable for its inexpensiveness, it generally has hygroscopicity and contains much moisture. To obtain a nitride semiconductor with a p-type electric property, it is important to lower the moisture concentration thereof. A method for obtaining nitrogen having a moisture concentration of at most 1 ppb is similar to that in the case of the nitrogen carrier gas described above. The use of argon as the second carrier gas is preferable for obtaining a nitride semiconductor with a p-type electric property because argon has less hygroscopicity.

In the second step of the present invention, supply of the Group III raw material may be stopped, or may be continued. Continuous supply of the Group III raw material makes it possible to prevent an outermost surface of the nitride semiconductor layer from being roughened by reevaporation in the temperature lowering process. An amount of the Group III raw material to be supplied in the case of continuous supply is preferably set to be, for example, at most one-fifth of the amount to be supplied when the nitride semiconductor layer is formed. An amount to be supplied exceeding one-fifth is not preferable because a droplet-like product is formed on the nitride semiconductor layer, or a nitride semiconductor layer of poor quality is stacked. In the present embodiment described below, the case where supply of the Group III raw material is stopped is mainly described for simplicity.

A flow quantity of the second carrier gas in the second step is preferably larger than that of the nitrogen carrier gas in the first step. This is because an ammonia concentration in the second step according to the present invention is a concentration significantly lower than that in the conventional practice, and hence it is necessary to lower the temperature as fast as possible after the first step in order to prevent a surface of the nitride semiconductor layer from being roughened. Particularly if argon is used as the second carrier gas, argon has thermal conductivity lower than that of nitrogen, so that a larger flow quantity is required than in the case where nitrogen is used.

In the step of lowering a temperature in the second step, time required for lowering the temperature to 400° C. is preferably at most 25 minutes, and more preferably at most 20 minutes. The time required for cooling down to 400° C. exceeding 25 minutes is not preferable because there arises a problem such as a roughened surface of the nitride semiconductor layer, or failure to obtain an ohmic electrode after the completion of crystal growth (increase in resistivity). Although the lower limit value of the cooling time is not particularly set, it is preferably at least three minutes, and more preferably at least five minutes, because the nitride semiconductor layer more easily obtains p-type electric property after the completion of crystal growth when being exposed to the ammonia atmosphere for a certain amount of time.

In the step of lowering a temperature in the second step, after the temperature is lowered to 600° C., supply of ammonia may be stopped, or ammonia may be allowed to flow continuously until a room temperature is reached. If ammonia is allowed to flow until 600° C. is reached, p-type conductivity can be exhibited in low resistivity with high reproducibility after the completion of crystal growth. Furthermore, supply of ammonia until 400° C. is reached is preferable because a surface of the nitride semiconductor layer is hardly roughened even if supply of ammonia is subsequently stopped and the second carrier gas is exclusively supplied, and even if at least 30 minutes elapse for reaching an allowable temperature for substrate transfer (approximately 180° C.) from 400° C.

In the second step, it is also possible to use dimethyl hydrazine or monomethyl hydrazine at a concentration of at least 0.01% and at most 2% as the material containing N. In the case of dimethyl hydrazine, for example, the concentration is calculated by (a flow quantity of dimethyl hydrazine)×(a vapor pressure of dimethyl hydrazine)/(an atmospheric pressure)/(a flow quantity of the second carrier gas+the flow quantity of dimethyl hydrazine×the vapor pressure of dimethyl hydrazine/the atmospheric pressure). Dimethyl hydrazine or monomethyl hydrazine is a reducing agent more effective than ammonia in reduction, so that it enables obtainment of a nitride semiconductor layer exhibiting p-type conductivity after the completion of crystal growth more effectively when compared with ammonia. If dimethyl hydrazine or monomethyl hydrazine is used as the material containing N in the second step, cooling down to 600° C. is preferably performed within 18 minutes.

A p electrode suitable for the p-type nitride semiconductor obtained by the present invention contains at least palladium or platinum. The use of a p electrode containing such a material enables further reduction in contact resistance and further reduction in power consumption in a nitride semiconductor-based light-emitting element or an electronic device.

<A Mode for Obtaining with Higher Reproducibility a P-Type Nitride Semiconductor Having Low Resistivity after the Second Step>

To obtain a nitride semiconductor layer exhibiting a p-type electric property after the completion of growth as in the present invention, it is preferable to lower a crystal defect density in the nitride semiconductor layer. This is because the crystal defect inhibits activation of Mg and adversely affects a p-type electric property. The experimental results obtained by the inventors of the present invention revealed that if a nitride semiconductor layer having p-type impurities added thereto as well as a nitride semiconductor layer serving as an underlying layer thereof failed to have favorable crystallinity, it was difficult to obtain much higher reproducibility and sufficient resistivity in the nitride semiconductor layer after the completion of growth. If a light-emitting element is to be fabricated, an underlying layer of the p-type nitride semiconductor layer is usually an n-type semiconductor layer having n-type impurities added thereto. Here, the n-type semiconductor layer refers to an n-type GaN layer, an n-type AlGaN layer, an n-type InAlGaN layer, an n-type InGaN, or the like.

If the nitride semiconductor layer having n-type impurities added thereto has poor crystallinity, a nitride semiconductor layer formed thereon is also affected thereby. To prevent this, accurate control of a concentration of the n-type impurities was found to be important. More specifically, if Si is used as the n-type impurities, an Si concentration in the n-type nitride semiconductor is preferably at most $7 \times 10^{17}$ cm$^{-3}$, and more preferably at most $5 \times 10^{17}$ cm$^{-3}$. Furthermore, it is preferable that the n-type nitride semiconductor layer having such an Si concentration accounts for at least 50% of the plurality of n-type semiconductor layers. This lowers a crystal defect density in the n-type semiconductor layers, and consequently, also lowers a crystal defect density in the nitride semiconductor layers, so that it is possible to obtain with much higher reproducibility a p-type nitride semiconductor having low resistivity after the completion of crystal growth.

Second Embodiment

A second embodiment of the present invention can mainly solve the second problem.

After the first and second steps according to the present invention, the nitride semiconductor layer having a p-type electric property was subjected to an annealing treatment in an inert gas for at least one minute and at most 15 minutes. This is the third step according to the present invention. By adding the third step to the first and second steps according to the present invention, resistivity of the nitride semiconductor layer is further reduced.

Most important effects obtained in the second embodiment of the present invention (the effects found in Example 2 described below) will be described in advance, and then various modes of the third step will be described, and the effects of the present invention will be described in detail, illustrating specific experimental data in Example 2.

Clearly, resistivity of a nitride semiconductor layer obtained by subjecting the nitride semiconductor layer, which has been obtained by the first and second steps according to the present invention, to the annealing treatment in the third step, was lower than that of a nitride semiconductor obtained by subjecting the nitride semiconductor, which had significantly high resistance and failed to exhibit p-type conductivity after the completion of crystal growth (which was subjected only to the first step), to the annealing treatment in the same third step. Furthermore, however long the latter sample was subjected to the annealing treatment, it could not obtain resistivity comparable to that of the former sample. Moreover, when the annealing treatment in the third step was performed to measure annealing time when resistivity of each of the samples became approximately constant, the former sample required shorter time than the latter sample. This means that the use of the method of manufacturing the p-type nitride semiconductor according to the present invention only requires shorter annealing time even if the annealing treatment (the third step) is performed. This is convenient for a light-emitting element that essentially requires an active layer containing In because it is possible to prevent thermal damage to, and hence degradation of, the active layer containing In due to the annealing treatment step. Consequently, improvement in luminous efficiency and increased lifetime of the light-emitting element can be expected.

After the second step of the present invention, the substrate may be removed from the MOCVD device and subjected to the annealing treatment in the third step, or alternatively, the substrate may be subjected to the annealing treatment in the third step still in the MOCVD device. If the substrate is removed from the MOCVD device and subjected to the annealing treatment in the third step, an RTA (a Rapid Thermal Annealing) device can be used as the annealing treatment device. The RTA device is preferably used because it quickly raises and lowers the temperature, causing less thermal damage to the nitride semiconductor layer. The RTA device is preferably used when several nitride semiconductor layers stacked on the substrate include an active layer made of InGaN or InAlGaN, for example, because such an active layer is particularly vulnerable to thermal damage caused by annealing.

Here, for the inert gas in the third step, nitrogen or argon can be used. Argon has thermal conductivity lower than that of nitrogen, and hence heat is less likely to be drawn by the inert gas existing on the periphery of the substrate, so that improvement in heat distribution in the substrate makes it possible to achieve uniform distribution of a p-type electric property in a surface.

An amount of argon to be supplied per minute is preferably at least one liter and at most 10 liters. Argon has low thermal conductivity, and hence after the completion of the annealing treatment at a desired annealing temperature, cooling is preferably performed by allowing argon to flow at a flow quantity larger than that in the annealing treatment. For example, there is adopted a flow quantity approximately 1.2 times to two times as large as that of argon supplied in the annealing treatment. This makes it possible to suppress thermal damage to the nitride semiconductor layer (particularly a nitride semiconductor layer containing In) in the temperature lowering process after the completion of the annealing treatment. It is more preferable that after the completion of the annealing treatment, argon is substituted by nitrogen to perform cooling with nitrogen, which has higher thermal conductivity than argon. For the argon, argon having a purity of 99.9999% to 99.99% can be used. The use of argon having a purity of 99.99% exhibited slightly greater improvement in p-type electric property.

The annealing temperature in the third step according to the present invention is preferably at least 700° C. and at most 900° C. An annealing temperature lower than 700° C. and an annealing temperature exceeding 900° C. are not preferable because the former provides almost no improvement in electric property by the annealing treatment, while the latter tends to damage the nitride semiconductor. The more preferable annealing temperature is at least 800° C. and at most 850° C.

Annealing time in the third step is preferably at least one minute and at most 15 minutes, and more preferably at least three minutes and at most 10 minutes. Annealing time exceeding 15 minutes is not preferable because the nitride semiconductor layer is thermally damaged and its p-type electric property tends to deteriorate. Annealing time less than 1 minute is not preferable because an annealing treatment cannot sufficiently be performed, so that the p-type electric property obtained thereby remains almost the same as that after the second step, and the effects of the third step cannot be observed. If the RTA device is selected as the annealing treatment device, the annealing time is set such that the total time required for reaching a desired annealing temperature, namely, at least 700° C. and at most 900° C., more preferably at least 800° C. and at most 850° C., is at least one minute and at most 15 minutes. For example, if a step of annealing at a desired annealing temperature only for two minutes and then performing cooling for three minutes (the cooling herein refers to lowering of the temperature to 400° C. or lower) is repeated five times, the total annealing time is two minutes×five times=10 minutes in total. By repeating such a thermal cycle, it is possible to further prevent thermal damage to the nitride semiconductor layer (particularly a nitride semiconductor layer containing In) than in continuous annealing.

As a more preferable mode in the third step according to the present invention, ammonia is further added at a concentration of at least 0.01% and at most 5% in addition to the inert gas. This improves a p-type electric property. Other effects are similar to those described above. At that time, the annealing temperature may be set to at least 700° C. and at most 920° C., more preferably at least 800° C. and at most 900° C., and further preferably at least 810° C. and at most 880° C. This is because if ammonia is added in addition to the inert gas, the upper limit value of the temperature at which the nitride semiconductor is thermally damaged is raised, so that the annealing temperature can be set higher. However, the annealing treatment at a temperature of at least 850° C. tends to cause thermal damage to the nitride semiconductor layer (particularly a nitride semiconductor layer containing In) even though ammonia is added, and hence the annealing time is preferably at least one minute and at most 10 minutes.

As a more preferable mode in the third step according to the present invention, hydrogen is further added at a concentration of at least 10 ppm and at most 500 ppm in addition to the inert gas. This slightly improves a p-type electric property according to the present invention. Other effects are similar to those described above. The annealing temperature at that time is at least 700° C. and at most 850° C., more preferably at least 800° C. and at most 850° C. However, annealing in a hydrogen-containing atmosphere for long time results in the nitride semiconductor layer being etched and warped, and hence deterioration in p-type electric property. Therefore, the annealing time is required to be controlled accurately. The annealing time in the case where hydrogen is further added in addition to the inert gas is preferably at least one minute and at most 10 minutes, and preferably at least three minutes and at most seven minutes. Furthermore, the RTA device is desirably used as the annealing device.

EXAMPLE 1

A detailed example of the first embodiment will hereinafter be described.

A sample A in the present example was made of a C-plane sapphire substrate (corresponds to the substrate in the present application), an undoped GaN layer of approximately 3 μm provided on the sapphire substrate, and a GaN layer doped with Mg and of approximately 0.6 μm (which corresponds to the nitride semiconductor layer formed in the first step) provided on the undoped GaN layer. A method of manufacturing the Mg-doped GaN layer by the first step of the present invention included the steps of growing the Mg-doped GaN layer by supplying a hydrogen carrier gas and a nitrogen carrier gas at 25 liters per minute and at 6.5 liters per minute, respectively, at a growth temperature of 1030° C., and supplying tri-methyl gallium as a Group III raw material at 40 cc per minute, bis(ethyl cyclopentadienyl) magnesium as a raw material containing Mg at 60 cc per minute, and ammonia as a Group V raw material containing N at a concentration of at least 0.01% and less than 20% at six liters per minute. As such, the first step according to the present invention was completed.

Successively, in the second step according to the present invention, supply of the hydrogen carrier gas, the tri-methyl gallium, and the bis(ethyl cyclopentadienyl) magnesium was stopped and heating of the substrate was stopped, and nitrogen was supplied as the second carrier gas at 14.7 liters per minute, while the flow quantity of ammonia was lowered to 0.3 liter per minute. Here, the ammonia concentration was 2%. Cooling down from 1030° C. to 400° C. was performed for approximately 16 minutes, and the second step was completed. Cooling down from 400° C. to normal temperature was performed by stopping the supply of ammonia and further increasing the flow rate of the second carrier gas to 15 liters per minute.

Furthermore, a sample B was fabricated as a comparative example. Here, sample B was fabricated by the same fabricating method as that of the sample A, except that an ammonia concentration in the second step was 30%. More specifically, a temperature of sample B was lowered after the completion of the first step of the present invention, while nitrogen and ammonia were supplied as the second carrier gas at 10.5 liters per minute and at 4.5 liters per minute, respectively.

Next, electric properties of sample A and sample B were compared with each other. Hall measurement was used as a method of evaluating the electric properties of these samples.

The results showed that sample A exhibited a p-type electric property after the second step without being subjected to an annealing treatment. For specific electric property values, resistivity was approximately 3.8 Ωcm, and a hole carrier concentration was $2.4 \times 10^{17}$ cm$^3$. In contrast, sample B had significantly high resistance after the second step, and hence its electric property (resistivity and a hole carrier concentration) could not be evaluated by Hall measurement. Accordingly, measurement of resistivity of sample B was attempted by means of a measurement device utilizing a four-probe method, with which resistivity of up to 12 kΩcm can be measured. However, owing to its significantly high resistance, resistivity could not be measured. In view of a measurement limitation of the measurement device, it was found that sample B had resistivity higher than at least 12 kΩcm.

EXAMPLE 2

A detailed example of the second embodiment will hereinafter be described.

Samples A and B, which were fabricated by the method of Example 1, were further subjected to the third step according to the present invention. Here, nitrogen was used as an inert gas in the third step, and an annealing temperature of 800° C. was used.

Figure 2:
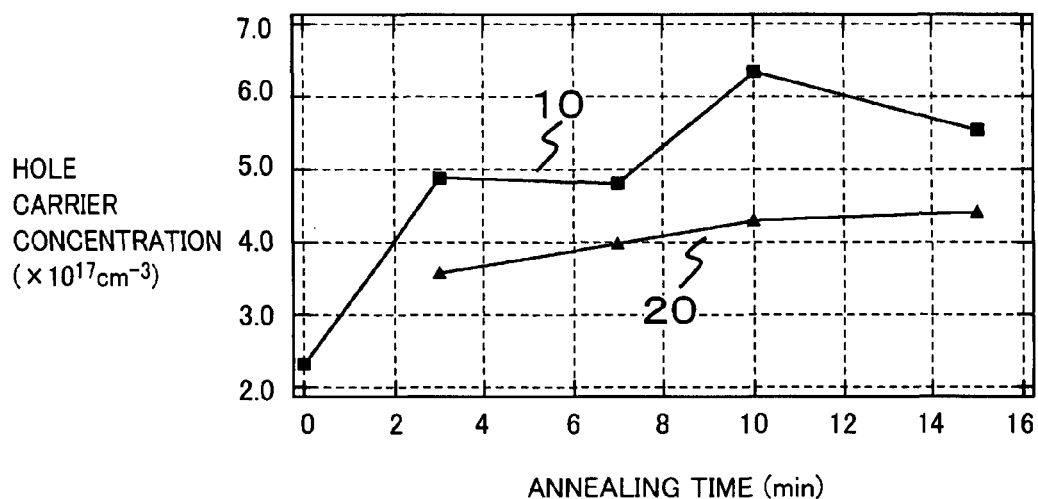
FIG. 2 provides an example of experimental data showing a relationship between annealing time and a hole carrier concentration.

The results are shown in FIGS. 1 and 2. An axis of abscissas in each of FIGS. 1 and 2 represents annealing time, and an axis of ordinates in FIG. 1 represents resistivity, while an axis of ordinates in FIG. 2 represents a hole carrier concentration. In both of FIGS. 1 and 2, sample A of the present application is denoted as 10, while sample B as a comparative example is denoted as 20. Here, an electric property at annealing time of 0 minute in these drawings refers to the one obtained immediately after these samples were removed from the MOCVD device (after the completion of crystal growth). The electric property after the completion of crystal growth is as shown in Example 1.

FIGS. 1 and 2 show that sample A has resistivity lower than that of sample B (lower by approximately at least 20% with respect to sample B as a comparative example), and also has a higher hole carrier concentration. Here, the following points should be noted. Firstly, sample B, which had high resistance as an electric property obtained immediately after it was removed from the MOCVD device and failed to exhibit a p-type electric property, could not achieve an electric property comparable to that obtained by sample A, for whatever long annealing time sample B was subjected to the subsequent annealing treatment. With reference to FIG. 1, when annealing time is increased, more specifically, approximately when 10 minutes elapse, gradual increase in resistivity starts. When annealing time exceeds 15 minutes and is further increased, the nitride semiconductor layer is thermally damaged, resulting in further deterioration in resistivity. In view of this, it was determined that for whatever long annealing time sample B was subjected to the annealing treatment, it was not comparable to sample A. Secondly, sample B achieved approximately constant resistivity at annealing time of approximately seven minutes, whereas sample A achieved approximately constant resistivity at annealing time of approximately three minutes. In other words, it was found that sample A, which was fabricated by the manufacturing method of the present invention, had resistivity lower (a carrier concentration higher) than that of sample B as a comparative example, and only required short time for the annealing treatment. The latter feature, in particular, is convenient to a light-emitting element essentially requiring an active layer containing In such as InGaN, because the active layer containing In is vulnerable to thermal damage. As such, the use of the method of manufacturing the p-type nitride semiconductor according to the present invention only requires short annealing time for obtaining low resistivity, so that it is possible to reduce thermal damage to the nitride semiconductor layer.

It is not known why such features are exhibited. It is estimated that, since even the same annealing step causes a significant difference in p-type electric property, sample A (which exhibited p-type electric property after the completion of crystal growth) obtains lower resistance in a p type in a mechanism different from that of sample B (which had significantly high resistance and failed to exhibit a p-type electric property after the completion of crystal growth).

EXAMPLE 3

A nitride semiconductor laser element in FIG. 3 includes a (0001)-plane n-type GaN substrate 100, an n-type GaN layer 101, an n-type AlGaN cladding layer 102, an n-type GaN light guide layer 103, a light-emitting layer 104, an intermediate layer 105, a carrier block layer 106 made of p-type AlGaN, a p-type GaN light guide layer 107, a p-type AlGaN cladding layer 108, a p-type GaN contact layer 109, an n electrode 110, a p electrode 111, and an SiO$_2$ dielectric film 112. Here, n-type AlGaN cladding layer 102 is configured with a first n-type AlGaN cladding layer 102a, a second n-type AlGaN cladding layer 102b, and a third n-type AlGaN cladding layer 102c.

Initially, an underlying layer of 1 μm as n-type GaN layer 101 was formed on n-type GaN substrate 100 at a growth temperature of 1050° C. by using the MOCVD device and applying ammonia as the Group V raw material, tri-methyl gallium as the Group III raw material, and SiH$_4$. The n-type GaN layer was stacked in order to improve surface morphology of the n-type GaN substrate, and relieve stress strain caused by grinding, which remains in the surface of the GaN substrate, to thereby form an outermost surface suitable for epitaxial growth.

Next, tri-methyl aluminum was used as the Group III raw material to grow n-type AlGaN cladding layer 102 made of first n-type Al$_{0.062}$Ga$_{0.938}$N cladding layer 102a having a thickness of 2.3 μm (an Si impurities concentration of $5 \times 10^{17}$/cm$^3$), second n-type Al$_{0.10}$Ga$_{0.90}$N cladding layer 102b having a thickness of 0.15 μm (an Si impurities concentration of $5 \times 10^{17}$/cm$^3$), and third n-type Al$_{0.062}$Ga$_{0.938}$N cladding layer 102c having a thickness of 0.1 μm (an Si impurities concentration of $5 \times 10^{17}$/cm$^3$). Successively, n-type GaN light guide layer 103 having a thickness of 0.1 μm (an Si impurities concentration of $3 \times 10^{17}$/cm$^3$) was grown. Subsequently, a temperature of the substrate was lowered to 750° C. to form light-emitting layer 104 having a three-cycle multiple quantum well structure. Here, light-emitting layer 104 used in the present embodiment was grown by forming an undoped In$_{0.003}$Ga$_{0.997}$N barrier layer having a thickness of 20 nm, an undoped In$_{0.09}$Ga$_{0.91}$N well layer having a thickness of 4 nm, an undoped In$_{0.003}$Ga$_{0.997}$N barrier layer having a thickness of 8 nm, an undoped In$_{0.09}$Ga$_{0.91}$N well layer having a thickness of 4 nm, an undoped In$_{0.003}$Ga$_{0.997}$N barrier layer having a thickness of 8 nm, and an undoped In$_{0.09}$Ga$_{0.91}$N well layer having a thickness of 4 nm, in this order.

Next, intermediate layer 105 (a layer thickness of 70 nm) was grown. Intermediate layer 105 refers to a layer in which an undoped In$_{0.003}$Ga$_{0.997}$N layer having a thickness of 20 nm, an Si-doped GaN layer having a thickness of 10 nm (an Si impurities concentration of approximately $7\times10^{17}/cm^3$), and an undoped GaN layer having a thickness of 40 nm were grown in this order.

Here, the n-type semiconductor layers doped at an Si concentration of at most $7\times10^{17}$ cm$^{-3}$ was designed to account for at least 50% of the n-type semiconductor layers.

Next, the temperature of the substrate was raised again to 1050° C. to successively grow p-type carrier block layer 106 made of AlGaN and having a thickness of 20 nm, p-type GaN light guide layer 107 of 20 nm, p-type AlGaN cladding layer 108 of 0.5 μm, and p-type GaN contact layer 109 of 0.1 μm. Here, the composition ratio of Al in p-type carrier block layer 106 made of AlGaN was 30%, while the composition ratio of Al in p-type AlGaN cladding layer 108 was 5.5%. Furthermore, Mg (bis(ethyl cyclopentadienyl) magnesium) was used as the p-type impurities.

The following conditions were used for the gas for each layer having the p-type impurities added thereto. P-type carrier block layer 106 made of AlGaN required a nitrogen carrier gas at 19.9 liters/minute, a hydrogen carrier gas at 0.6 liter/minute, and ammonia at 9.5 liters/minute. Each of p-type GaN light guide layer 107, p-type AlGaN cladding layer 108, and p-type GaN contact layer 109 required a nitrogen carrier gas at 8.5 liters/minute, a hydrogen carrier gas at 35.4 liters/minute, and ammonia at five liters/minute, at a flow velocity of 108 cm/second. Accordingly, p-type GaN light guide layer 107, p-type AlGaN cladding layer 108, and p-type GaN contact layer 109 correspond to the nitride semiconductor layer formed by the first step of the present application. Accordingly, the total layer thickness of the nitride semiconductor layers formed in the first step was 0.62 μm, and the total layer thickness of a layer including a nitride semiconductor having at least an Al composition ratio of at least 2%, out of these nitride semiconductor layers, was 0.5 μm.

In addition to a function as a carrier block layer, p-type carrier block layer 106 made of AlGaN also has a function of preventing In in the light-emitting layer made of InGaN from evaporating during growth. Accordingly, in order to utilize the latter function rather than the effects of the present application, the ratio of the nitrogen carrier gas was made to be higher than that of the hydrogen carrier gas.

Successively, after p-type GaN contact layer 109 was grown, the flow quantities of the nitrogen carrier gas, the hydrogen carrier gas, and ammonia were switched to 18.9 liters/minute, 0, and 0.6 liter/minute, respectively, and the temperature was lowered from 1050° C. to 400° C. for 18 minutes. The epi substrate was then removed from the MOCVD device and subjected to an annealing treatment for annealing time of five minutes, at an annealing temperature of 820° C., in an atmosphere of argon having a purity of 99.99%.

N electrode 110 was formed at a back surface of the epi substrate in an order of Hf/Al. Au was then evaporated onto n electrode 110 as an n-type electrode pad. Instead of the n electrode material described above, Ti/Al, Ti/Mo, Hf/Au or the like may also be used.

The p electrode portion was etched in a stripe-like manner to form a ridge stripe portion. The width of the ridge stripe portion was 1.6 μm. Subsequently, SiO$_2$ dielectric film 112 was evaporated thereon to achieve a thickness of 200 nm, and p-type GaN contact layer 109 was exposed, and p electrode 111 was formed by evaporating Pd (15 nm)/Mo (15 nm)/Au (200 nm) thereon in this order. Although Pd was used in the present example, Pt may also be used instead thereof.

The composition ratio of Al in p-type carrier block layer 106 made of AlGaN as described above was 30%. However, it can be adjustable within a range of at least 10% and at most 35%.

Each of the n-type AlGaN cladding layer and the p-type AlGaN cladding layer described above may adopt another Al composition ratio. Instead of p-type AlGaN cladding layer 108, it may be possible to use a superlattice made of Mg-doped GaN/Mg-doped AlGaN.

EXAMPLE 4

The present example is similar to Example 3, except that a p-type InGaN contact layer was used instead of p-type GaN contact layer 109 in Example 3.

The p-type InGaN contact layer was formed on p-type AlGaN cladding layer 108 to have a layer thickness of 0.05 μm. Although the present example adopted an In composition ratio of 3% in the p-type InGaN contact layer, the p-type InGaN contact layer may also be fabricated at another In composition ratio. The conditions for gases forming the p-type InGaN contact layer were a nitrogen carrier gas at 8.5 liters/minute, no hydrogen carrier gas, and ammonia at 3.5 liters/minute. P-type AlGaN cladding layer 108 was grown at 1050° C., while the p-type InGaN contact layer was grown at 770° C. Accordingly, p-type GaN light guide layer 107 and p-type AlGaN cladding layer 108 correspond to the nitride semiconductor layers formed in the first step of the present invention. The total layer thickness of the layers corresponding to the nitride semiconductor layers formed in the first step of the present invention was 0.52 μm, and the total layer thickness of a layer including a nitride semiconductor having at least an Al composition ratio of at least 2%, out of the nitride semiconductor layers, was 0.5 μm.

Successively, after the p-type InGaN contact layer was grown, the flow quantities of the nitrogen carrier gas, the hydrogen carrier gas, and ammonia were switched to 19 liters/minute, 0, and one liter/minute, respectively, and the temperature was lowered from 770° C. to 400° C. for 8 minutes. Here, a temperature at which the second step of the present application is to be initiated was identified as a temperature immediately before the completion of crystal growth, namely, 770° C. Next, the epi substrate was removed from the MOCVD device and subjected to an annealing treatment for annealing time of 10 minutes, at an annealing temperature of 810° C., in a nitrogen atmosphere. The subsequent manufacturing method is similar to that of Example 3.

EXAMPLE 5

There was examined a difference in resistivity of a p-type nitride semiconductor after the completion of the growth according to the present invention (after the second step) between the case where bis(ethyl cyclopentadienyl) magnesium was used, and the case where biscyclopentadienyl magnesium was used, as the raw material containing Mg in the first step in the first embodiment according to the present invention. Here, the sample used for the examination was GaN having Mg added thereto. As a result, in the case of bis(ethyl cyclopentadienyl) magnesium, resistivity after the completion of growth was approximately 3-6 Ωcm. In contrast, in the case of biscyclopentadienyl magnesium, resistivity was approximately 6-8 Ωcm. In view of these results, bis(ethyl cyclopentadienyl) magnesium is superior to biscyclopentadienyl magnesium in resistivity after the completion of growth.

EXAMPLE 6

An annealing treatment was performed by further adding methane to the inert gas in the third step in the second embodiment of the present invention. A sample used in the present example was GaN having Mg added thereto. The GaN having Mg added thereto was fabricated by the method of the first embodiment. Here, biscyclopentadienyl magnesium was used as the raw material containing Mg in the first step. In the second step, a temperature was lowered to 400° C. while ammonia was allowed to flow at a concentration of 0.5%. Resistivity after the completion of growth (after the second step) was approximately 6 Ωcm, and p-type conductivity was exhibited.

Next, in the third step, annealing was performed in an atmospheric gas containing argon and methane at 800° C. for 15 minutes. Here, a methane concentration in argon was 10 ppm. After the annealing, a treatment with buffered hydrofluoric acid was performed for one minute, to form a p electrode containing Pd at a surface of the GaN sample having Mg added thereto. At that time, resistivity was approximately 2 Ωcm.

In the present example, the reason why methane was further added to the inert gas in the third step to perform annealing was to remove oxygen attached to the surface of the sample (remove an oxide film). This reduces abnormal contact resistance and improves yields. Although a methane concentration in argon was set to be 10 ppm in the present example, a concentration of at least 1 ppm and at most 100 ppm can produce similar effects. Although methane was added to argon in the present example, addition of methane to nitrogen also produces similar effects.

(As to a Semiconductor Device Utilizing the Manufacturing Method According to the Present Invention)

With the use of the method of manufacturing the p-type nitride semiconductor according to the present invention, it is possible to fabricate a semiconductor device including a p-type nitride semiconductor layer. This makes it possible to further reduce power consumption in the semiconductor device when compared with the conventional one, and to implement downsizing of the semiconductor device (provision for mobility) and driving for a long period of time. For example, it can preferably be used for a semiconductor device such as a nitride semiconductor laser, a nitride semiconductor light-emitting diode, a nitride semiconductor electronic device (nitride semiconductor-based transistor), an optical pickup device, a magnetooptical reproducing and recording device, a high-density recording and reproducing device, a laser printer, a bar code reader, a projector, or a white LED light source.

It should be understood that the embodiments disclosed herein are illustrative and not limitative in all aspects. The scope of the present invention is shown not by the description above but by the scope of the claims, and is intended to include all modifications within the equivalent meaning and scope of the claims.

The invention claimed is:

1. A method of manufacturing a p-type nitride semiconductor comprising:
   a first step of forming a nitride semiconductor layer by metal organic chemical vapor deposition by using a first carrier gas containing a nitrogen gas and a hydrogen gas of a flow quantity larger than a flow quantity of said nitrogen gas to thereby supply a raw material containing magnesium and a Group V raw material containing nitrogen (N); and
   a second step of lowering a temperature by using a second carrier gas to which a material containing nitrogen (N) is added of a concentration of at least 0.01% and less than 20%,
   Wherein ammonia is used at a concentration of at least 0.01% and at most 5% as said material containing nitrogen (N).

2. A method of manufacturing a p-type nitride semiconductor, comprising:
   a first step of forming a nitride semiconductor layer by metal organic chemical vapor deposition by using a first carrier gas containing a nitrogen gas and a hydrogen gas of a flow quantity larger than a flow quantity of said nitrogen gas to thereby supply a raw material containing magnesium and a Group V raw material containing nitrogen (N); and
   a second step of lowering a temperature by using a second carrier gas to which a material containing nitrogen (N) is added at a concentration of at least 0.01% and less than 20%, wherein a flow quantity of the second carrier gas is larger than the flow quantity of the nitrogen gas in the first carrier gas.

3. A method of manufacturing a p-type nitride semiconductor, comprising:
   a first step of forming a nitride semiconductor layer by metal organic chemical vapor deposition by using a first carrier gas containing a nitrogen gas and a hydrogen gas of a flow quantity larger than a flow quantity of said nitrogen gas to thereby supply a raw material containing magnesium and a Group V raw material containing nitrogen (N); and
   a second step of lowering a temperature by using a second carrier gas to which a material containing nitrogen (N) is added at a concentration of at least 0.01% and less than 20%, wherein said second step is a step of lowering the temperature to 400° C. or lower, and time required for reaching 400° C. is at most 25 minutes.

4. A method of manufacturing a p-type nitride semiconductor, comprising:
   a first step of forming a nitride semiconductor layer by metal organic chemical vapor deposition by using a first carrier gas containing a nitrogen gas and a hydrogen gas of a flow quantity larger than a flow quantity of said nitrogen gas to thereby supply a raw material containing magnesium and a Group V raw material containing nitrogen (N); and
   a second step of lowering a temperature by using a second carrier gas to which a material containing nitrogen (N) is added at a concentration of at least 0.01% and less than 20%,
   Wherein dimethyl hydrazine is used at concentration at least 0.01% and at most 2% as said material containing nitrogen (N).

5. A method of manufacturing a p-type nitride semiconductor, comprising:
   a first step of forming a nitride semiconductor layer by metal organic chemical vapor deposition by using a first carrier gas containing a nitrogen gas and a hydrogen gas of a flow quantity larger than a flow quantity of said nitrogen gas to thereby supply a raw material containing magnesium and a Group V raw material containing nitrogen (N);
   a second step of lowering a temperature by using a second carrier gas to which a material containing nitrogen (N) is added at a concentration of at least 0.01% and less than 20%, and
   a third step of subjecting the nitride semiconductor layer to an annealing treatment after said step in an inert gas for at least one minute and at most 15 minutes.

6. The method of manufacturing the p-type nitride semiconductor according to claim 5, wherein the annealing treatment in the third step is performed at at least 700° C. and at most 900° C.

7. The method of manufacturing the p-type nitride semiconductor according to claim 5, wherein in said third step, ammonia is further added at a concentration of at least 0.01% and at most 5% in addition to said inert gas.

8. The method of manufacturing the p-type nitride semiconductor according to claim 5, wherein in said third step, hydrogen is further added at a concentration of at least 10 ppm and at most 500 ppm in addition to said inert gas.

* * * * *